(12) United States Patent
Miyauchi et al.

(10) Patent No.: US 6,635,403 B2
(45) Date of Patent: Oct. 21, 2003

(54) LITHOGRAPHY APPARATUS, LITHOGRAPHY METHOD AND METHOD OF MANUFACTURING MASTER PRINT FOR TRANSFER

(75) Inventors: Akihiro Miyauchi, Hitachi (JP); Lee Chahn, Hitachinaka (JP); Mitsuru Hasegawa, Hitachi (JP); Mitsuo Hayashibara, Hitachinaka (JP); Hiroshi Sasaki, Mito (JP)

(73) Assignee: Hitachi, Ltd., Tokyo (JP)

(*) Notice: Subject to any disclaimer, the term of this patent is extended or adjusted under 35 U.S.C. 154(b) by 66 days.

(21) Appl. No.: 09/960,407

(22) Filed: Sep. 24, 2001

(65) Prior Publication Data

US 2002/0101460 A1 Aug. 1, 2002

(30) Foreign Application Priority Data

Jan. 31, 2001 (JP) .................... 2001-022679

(51) Int. Cl.⁷ .............. G03F 7/26; G03F 5/00
(52) U.S. Cl. .............. 430/302; 430/311; 346/140.1
(58) Field of Search ............. 438/694, 758; 430/302, 311; 346/140.1

(56) References Cited

U.S. PATENT DOCUMENTS

| | | | |
|---|---|---|---|
| 5,500,326 A | * 3/1996 | Koboyashi et al. | 430/300 |
| 5,882,828 A | * 3/1999 | Kato et al. | 430/49 |
| 6,004,727 A | * 12/1999 | Verlinden et al. | 430/302 |
| 6,337,162 B1 | * 1/2002 | Irie | 430/5 |
| 6,542,237 B1 | * 4/2003 | Kyoh et al. | 356/401 |
| 2001/0036602 A1 | * 11/2001 | McGrew et al. | 430/321 |

FOREIGN PATENT DOCUMENTS

| | | |
|---|---|---|
| JP | 56-157091 A | 12/1981 |
| JP | 11-347478 A | 12/1999 |

* cited by examiner

Primary Examiner—Alexander Ghyka
(74) Attorney, Agent, or Firm—Antonelli, Terry, Stout & Kraus, LLP

(57) ABSTRACT

The invention relates to a lithographic apparatus for transferring a fine pattern having a line width less than 10 μm, a lithographic method, a structure for and a method of manufacturing an original master for transfer. The lithographic apparatus comprising an original master on which a pattern is formed within a two-dimensional plane, a slit for filling a medium in the pattern, a medium sump for feeding the medium, a pressure regulating mechanism for adjusting the pressure of the medium filled in the slit, and a lithographic substrate. With this apparatus, the pattern can be batch-transferred, thereby making it possible to easily manufacture electronic parts.

9 Claims, 14 Drawing Sheets

LITHOGRAPHY APPARATUS, LITHOGRAPHY METHOD AND METHOD OF MANUFACTURING MASTER PRINT FOR TRANSFER

BACKGROUND OF THE INVENTION

The present invention generally relates to a lithography apparatus, a lithography method and a method of manufacturing a master print for transfer, and more particularly to an apparatus for and a method of transferring a fine pattern having a line width less than 10 μm.

Among conventionally known lithography technologies, there has been a technology, such as shown in JP-11-347478A, in which a medium is jetted from a nozzle. FIG. 2 is a perspective view of the application device disclosed in JP-11-347478A. A substrate 201 to be applied or coated is set on a movable stage 202 which is movable in X-Y directions and rotatable. A transfer member 203, which is movable in a vertical (Z-axial) direction, is arranged above the substrate 201. The transfer member 203 has cylindrical containers 205 that contain therein mediums 204 and are connected thereto with pressure regulating mechanisms 206. The mediums 204 pressurized by the pressure regulating mechanisms 206 are discharged through a dispenser nozzle 207.

Among the conventionally known lithography technologies, disclosed in JP-56-157091A is the technology in which a pattern is formed by plating carried out after a catalyst is previously arranged. FIG. 3 is a schematic view of the ink-jet printer disclosed in JP-56-150791A. A movable stage 302 is arranged on a stationary base 306, and a substrate 301 is set on the movable stage 302. An ink gun 303 is arranged above the substrate 301, and an ink containing silver powder is dripped from the ink gun 303 by means of a piezoelectric element control device 304. The lithographic substrate 301 is moved in a horizontal plane under control of an NC control device 305 so as to form a pattern with the ink containing silver powder. Then, after activation of the silver powder, a predetermined copper wiring can be formed by electroless copper plating.

In the above-mentioned conventional technologies, the method of jetting medium through the dispenser nozzle has a problem that an original master material comes off within a line pattern which is two-dimensionarily closed, although no detailed structure of the dispenser nozzle for transferring the medium is described. FIGS. 4, 5 and 6 are for explaining the above-mentioned state in which the original master material comes off. FIG. 4 is a plan view of an original master 401 on which a line pattern is to be formed. A substrate 402 has a slit 403 formed therein for feeding a medium. FIG. 5 is a sectional view along line $A_1$–$B_1$ in FIG. 4. The medium 501 is fed through the slit 403. A line pattern as shown in FIG. 4 can be transferred as disclosed in JP-11-347478A. On the other hand, FIG. 6 is a plan view of an original master 601 on which a closed line pattern is to be formed. A substrate 402 has a slit 403 formed therein for feeding a medium. FIG. 7 shows a sectional view taken along line $A_2$–$B_2$ in FIG. 6. The medium 501 is fed out through the slit 403. As seen from FIG. 7, when forming a closed line pattern, a substrate portion 602 is separated from the remainder of the substrate 402, so that it comes off. Although the substrate portion 602 may be connected to the remainder of the substrate 402 by means of a beam or the like, the original master 60 of such a complicated structure will involve an increase in the manufacturing cost.

In the above-mentioned technologies, the method of forming a pattern by previously arranging catalyst and then performing plating has a limitation in the size of liquid drops to be dripped. That is, in order to jet an ink from an ink gun, it is required to increase a pressure applied to the ink so as to overcome the surface tension thereof. For example, when causing water drops to jet from the orifice of a diameter D (cm), the pressure given by the following formula is required:

$$P = 2 \times 72/D$$

where 72 is a surface tension of water (dyn/cm).

As understood from the above-mentioned formula, the pressure is in inverse proportion to the diameter of the orifice. In ink jet printers which are now available, several atmospheric pressure is applied to jet liquid drops from an orifice having a diameter of several tenth micrometers. A situation is assumed here that wiring having a line width of about 10 μm is to be formed. Provided that liquid drops having a diameter which is 1/100 of the width of the line are used to form the wiring, a diameter required for an orifice is almost 0.1 μm, and accordingly, an extremely high pressure has to be applied to an ink. There has been raised in the ink jet printers now available, a problem of breakage of components, specifically, bond separation between components. Accordingly, it is understood that forming of wiring having a line width less than 10 μm by the ink jet process is principally difficult.

BRIEF DESCRIPTION OF THE INVENTION

An object of the present invention is to provide an apparatus for and a method of batch-transferring a predetermined two-dimensional pattern.

Another object of the invention is to provide an original master which can batch-transfer a two-dimensional pattern, a method of manufacturing the original master, and a structure for feeding a medium onto the original master.

Still another object of the invention is to provide an apparatus for transferring a fine pattern with no limitation by surface tension, and a method thereof, and a method of forming a wiring pattern by plating after a fine pattern is transferred by means of catalyst.

Among the above objects, the apparatus for batch-transferring a two-dimensional pattern can be attained by a lithographic apparatus which comprises an original master formed with a slit of the two-dimensional pattern, a medium sump for feeding into the slit the medium to be transferred, a pressure regulating mechanism for adjusting the pressure of the medium filled in the slit, and a lithographic substrate. In particular, for a continuous two-dimensional pattern, this is achieved by a lithographic apparatus in which at least one supply pipe for the medium is provided between the slit and the medium sump.

Among the above objects, the method of batch-transferring a two-dimensional pattern can be attained, in a lithographic apparatus which comprises an original master formed with a slit of the two-dimensional pattern, a medium sump for feeding into the slit a medium to be transferred, a pressure regulating mechanism for adjusting the pressure of the medium filled in the slit, and a lithographic substrate, by the steps of pushing out the medium in the slit therefrom by means of the pressure regulating mechanism, and bringing the pushed-out medium into contact with the lithographic substrate.

Among the above objects, the original master which can transfer a predetermined two-dimensional pattern is attained by forming at least two layers, that is, a first layer and a second layer in this order on the surface of the original master, removing a part of the second layer so as to form a hollow zone therein, and filling in the hollow zone a medium to be transferred.

Among the above objects, the method of manufacturing an original master which can batch-transfer a predetermined two-dimensional pattern is attained by the steps of forming on a substrate at least a first layer and a second layer which are of different kinds, forming in the first layer a slit having the same pattern as the pattern to be transferred, and bringing etchant into contact with the second layer through the slit formed in the first layer to remove a part of the second layer.

Among the above objects, the structure for feeding a medium onto an original master which can batch-transfer a predetermined two-dimensional pattern, is attained, in a lithographic apparatus which comprises an original master formed with a slit of the pattern in a substrate, a medium sump for feeding into the slit the medium to be transferred, a pressure regulating mechanism for adjusting the pressure of medium filled in the slit, and a lithographic substrate, by forming at least two layers, that is, a first layer and a second layer in this order, on the surface of the original master, removing a part of the second layer so as to form a hollow zone therein, and feeding the medium from the medium sump by means of capillary effect. In particular, the supply of the medium to a continuous two-dimensional pattern can be attained by providing at least one medium pipe between the slit and the medium sump.

Among the above objects, another structure for feeding a medium onto an original master which can batch-transfer a predetermined two-dimensional pattern, is attained, in a lithographic apparatus which comprises an original master formed with a slit of the pattern in a substrate, a medium sump for feeding into the slit the medium to be transferred, a pressure regulating mechanism for adjusting the pressure of the medium filled in the slit, and a lithographic substrate, by providing as the slit, a first slit on the front surface side of the original master and at least one kind of a second slit which is formed in the bottom of the first slit and has a width small than that of the first slit, and feeding the medium into the second slit by means of capillary effect to transfer the medium all over the slit.

Among the above objects, the apparatus for transferring a fine pattern with no limitation by surface tension, is attained by evaporating a medium to draw a pattern on a lithographic substrate.

Among the above objects, the method of transferring a fine pattern with no limitation by surface tension is attained by, in a lithographic apparatus which comprises a liquid sump containing a medium, a pressure regulating mechanism for increasing the pressure in the liquid sump, a first orifice opened to the liquid sump, an evaporating chamber having the first orifice on one side thereof, a second orifice opened in one side of the evaporating chamber and a lithographic substrate, by the steps of increasing the pressure in the liquid sump by means of the pressure regulating mechanism to transfer the medium into the evaporating chamber through the first orifice, and evaporating the medium within the evaporating chamber to cause the medium to jet through the second orifice and adhere over the lithographic substrate.

Among the above objects, the method of forming a wiring pattern by plating after a fine catalytic pattern is transferred with no limitation by the surface tension is attained, in a lithographic apparatus which comprises a liquid sump containing a medium, a pressure regulating mechanism for increasing the pressure in the liquid sump, a first orifice opened to the liquid sump, an evaporating chamber having the first orifice formed in one side thereof, a second orifice opened in one side of the evaporating chamber, and a lithographic substrate, by the steps of increasing the pressure in the liquid sump by means of the pressure regulating mechanism to transfer the medium into the evaporating chamber through the first orifice, evaporating the medium within the evaporating chamber to cause the medium to jet through the second orifice and adhere over the lithographic substrate, and forming a metal pattern using the medium on the lithographic substrate as catalyst.

DETAILED DESCRIPTION OF THE INVENTION

Embodiment 1

Explanation will be hereinbelow made of an embodiment of the invention, in which the principle of lithography for transferring a pattern, a lithography apparatus and a lithography method are detailed.

Figure 1:
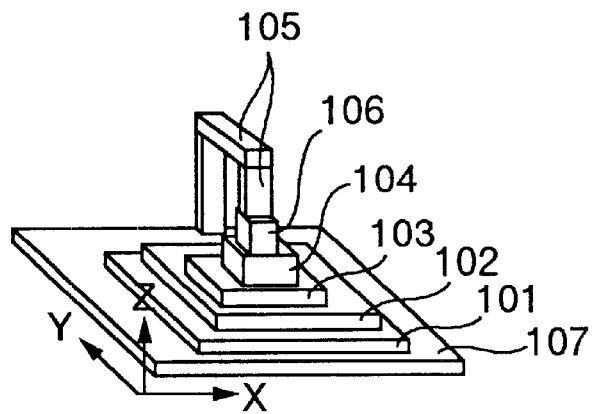
FIG. 1 is a perspective view of a lithographic apparatus according to the invention.
Figure 2:
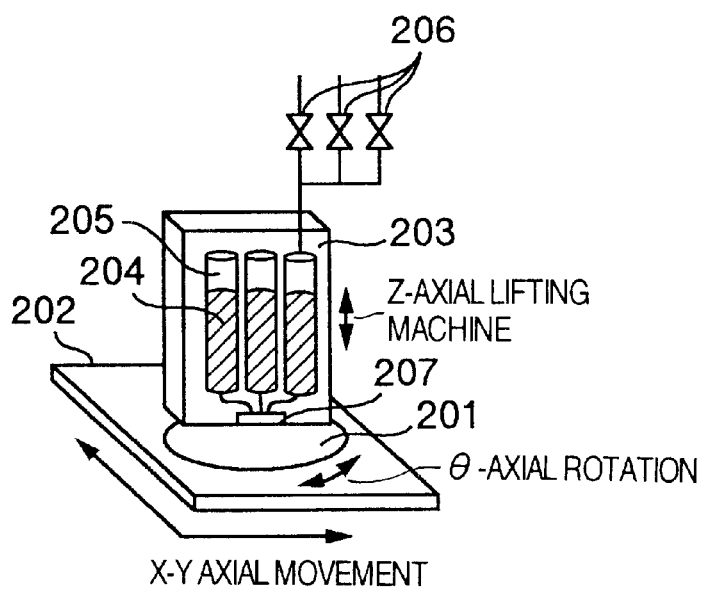
FIG. 2 is a perspective view of an application apparatus for explaining prior art.
Figure 3:
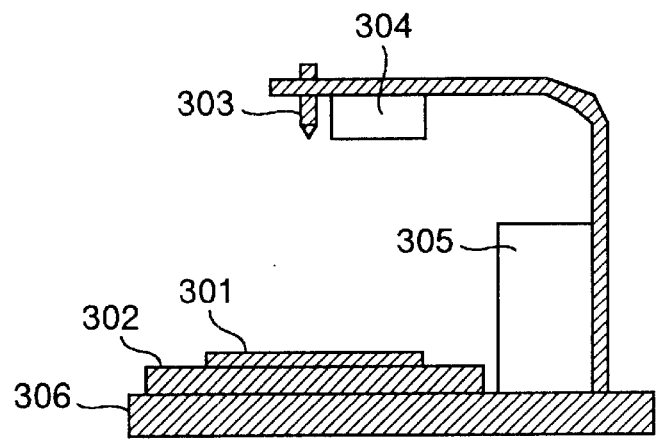
FIG. 3 is a schematic view of an ink jet printer for explaining prior art.
Figure 4:
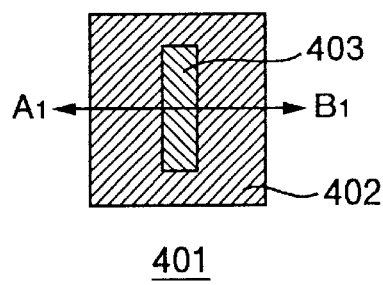
FIGS. 4 to 7 are views for explaining a condition wherein an original master of the prior art comes off.
Figure 5:
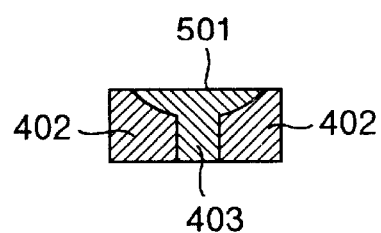
Figure 6:
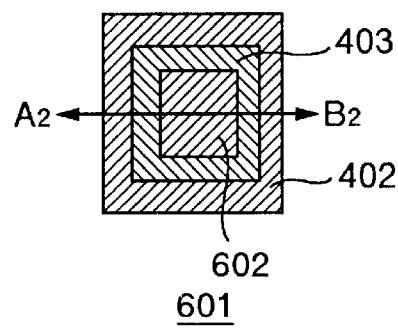
Figure 7:
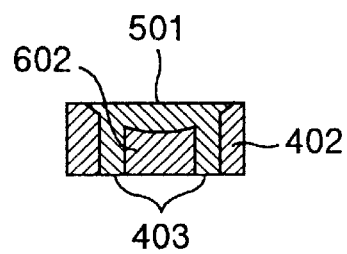

FIG. 1 is a perspective view of the lithography apparatus used in this embodiment. A glass substrate 102 having a side of 1 m length is set on a movable stage 101. The movable stage 101 can move the substrate 102 in a horizontal plane by means of a stepping motor. An original master 103 for transfer, in which integrally incorporated is a medium sump 104, is fixed by a Z-axial moving mechanism 106, which has a structure of being coupled to a stationary base 107 via the intermediary of a support arm 105. The original master 102 is a square shape having a one side of 140 mm length. The Z-axial moving mechanism 106 has a structure for moving the original master 103 and the medium sump 104 in the X-axial direction.

Figure 8:
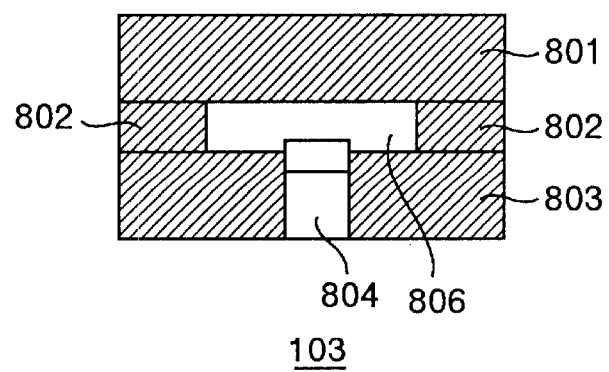
FIG. 8 is a view showing a cross section of an original master according to the invention.

FIG. 8 is a sectional view of the original maser 103, in which the longitudinal size thereof is enlarged for clarity. An oxidized film 802 having a thickness of 1.5 $\mu$m is formed underneath the silicon substrate 801, and a silicon film 803 having a thickness of 1.0 $\mu$m is formed underneath the oxide film 802. A slit 804 formed in the silicon film 803 has a width of 10 $\mu$m. The oxide film 802 between the slit 804 and the silicon substrate 801 is formed therein with a gap 806 having a width of 30 $\mu$m.

Figure 9:
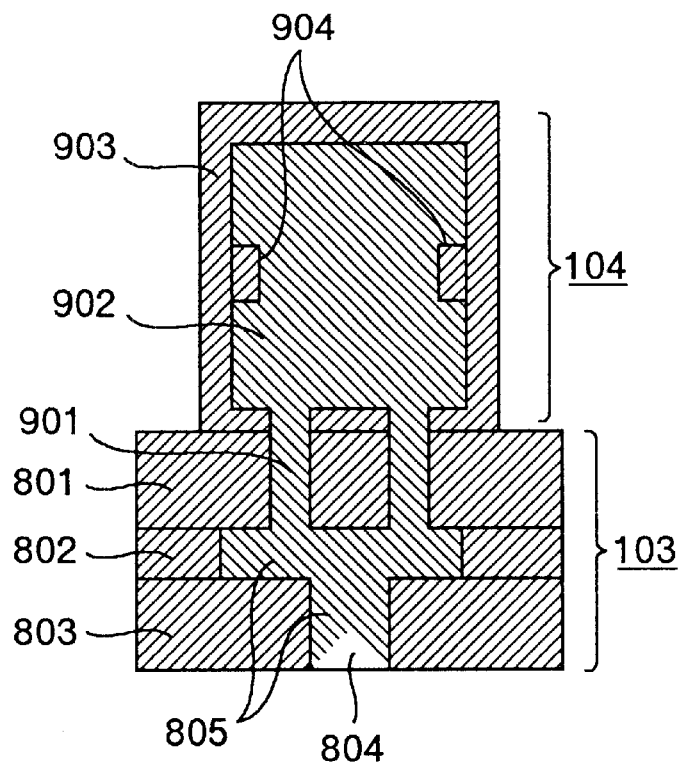
FIG. 9 is a sectional view for explaining connection between an original master and a medium sump according to the invention.

In the original master 103, as shown in FIG. 1, the medium sump 104 is connected to the original master 103. FIG. 9 is a section view for explaining the connection between the original master 103 and the medium sump 104. A medium container 903 contains therein medium 902 that is continuous to medium 805 in the original master 103 through a supply pipe 901. Further, the medium 902 is adapted to be filled in the gap 806 and the slit 804. The oxide film 802 and the slit 804 are filled therein the medium 805 to be transferred. The medium is composed of copper micro-particles diluted with toluene. The copper microparticles has a mean particle size of 50 nm, and has a density of about 10 wt. %. The medium sump 104 is incorporated therein with a heater 904, and the medium 902 around the heater is volumetrically expanded so as to increase the pressure in the medium container 903 when the heater 904 is energized.

Figure 30:
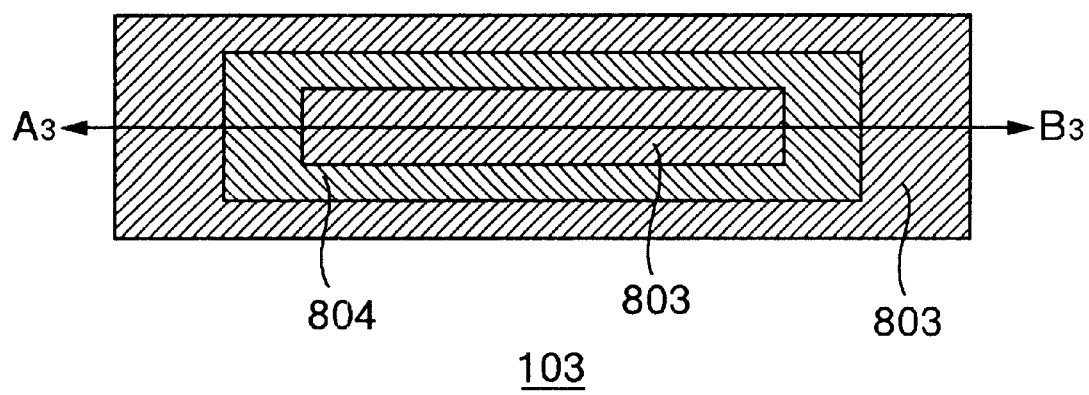
FIGS. 30 and 31 are plan views of an original master having a closed line pattern according to the invention.
Figure 31:
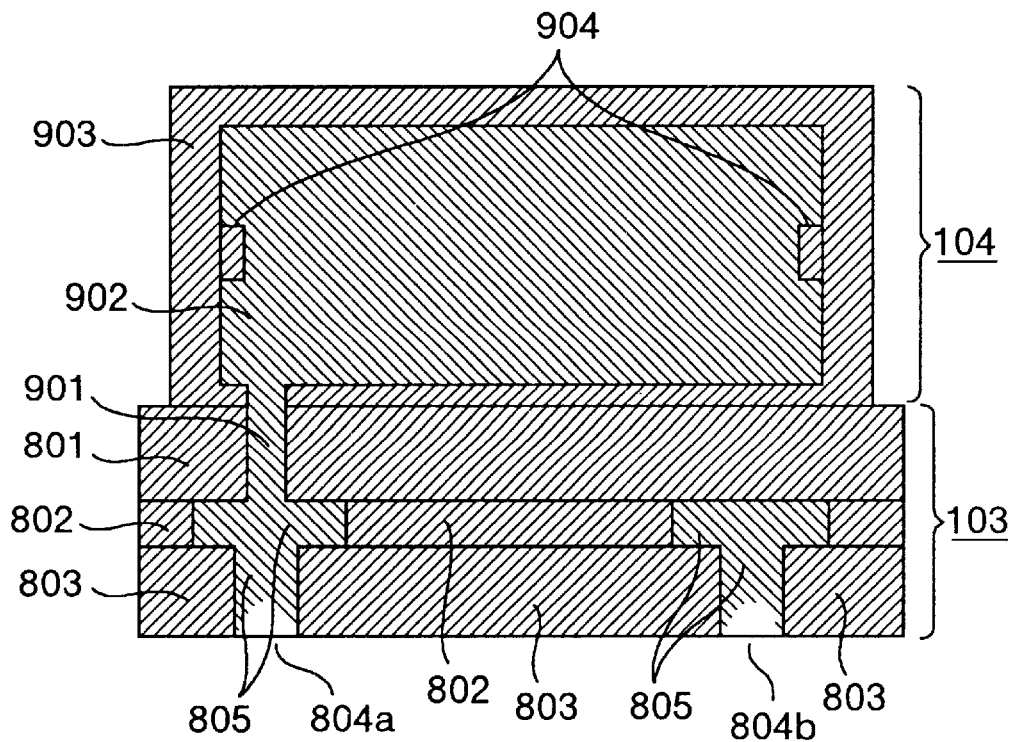

Next, explanation will be made of a structure of an original master having a closed line pattern. FIG. 30 is a plan view of the original master 103 having a closed line pattern. The slit 804 formed in the silicon film 803 defines the closed line pattern. FIG. 31 is a sectional view along line $A_3$–$B_3$ in FIG. 30. The medium 805 is fed all over the slit 804 through a zone where the oxide film 802 is partially removed.

Figure 10:
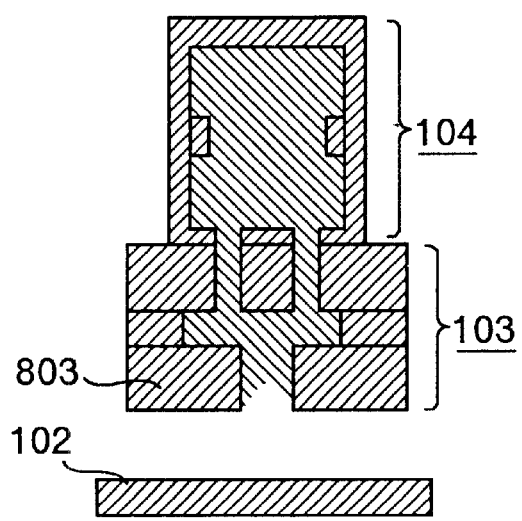
FIGS. 10 to 14 are views for explaining steps of forming a wiring pattern according to the invention.
Figure 11:
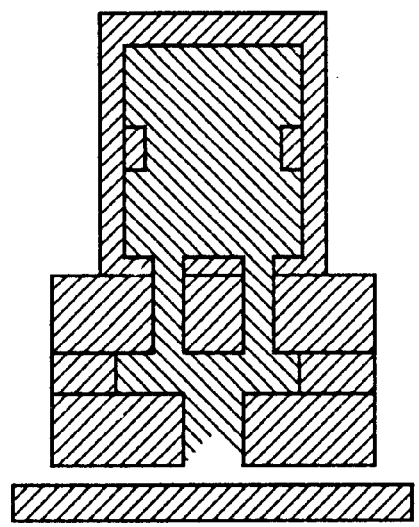
Figure 12:
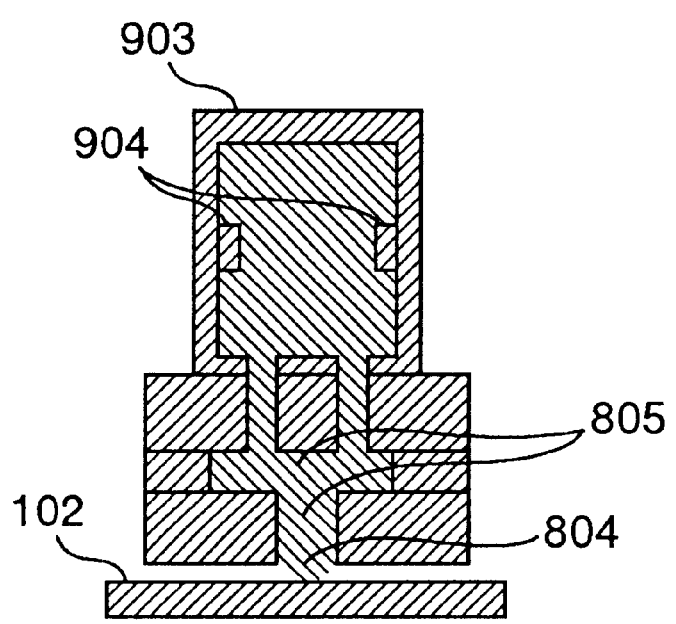

Next, explanation will be made of a printing process. FIGS. 10 to 17 are views for explaining process steps for forming a wiring pattern on the glass substrate 102. FIG. 10 shows a condition before the medium 805 is transferred onto the glass substrate 102. The glass substrate 102 is laid at a position spaced from the silicon film 803 by a distance of 100 $\mu$m. The original master 103 integrally incorporated with the medium sump 104 is moved toward the glass substrate 102 by the Z-axial moving mechanism 106, and as shown in FIG. 11, the distance between the glass substrate 103 and the original master 103 is shorted to about 10 $\mu$m. The Z-axial moving mechanism 106 is adapted to be driven by applying a voltage to a piezoelectric element. The drive mechanism can be materialized by applying a known technology for allowing a short needle to approach the surface of a sample in an inter-atom micrometer, to three corners of the original master 103 so that the original master can approach the original mater 103 in parallel with the glass substrate 102. Then, a heater 904 shown in FIG. 12, is energized for 100 msec so as to increase the pressure in the medium container 903 in order to allow the medium 804 to ooze out from the slit 804. Thus, the medium 805 makes contact with the glass substrate 102 so that a part of the medium 805 is transferred onto the glass substrate 102.

Figure 13:
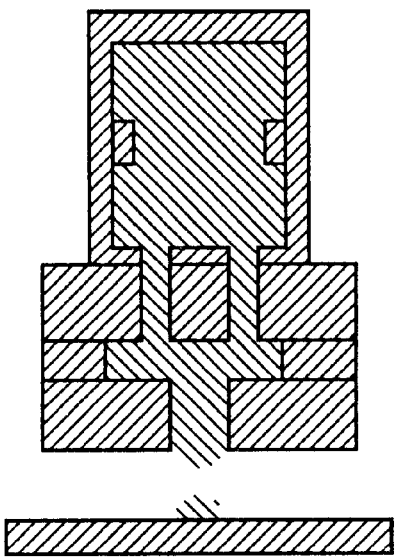
Figure 14:
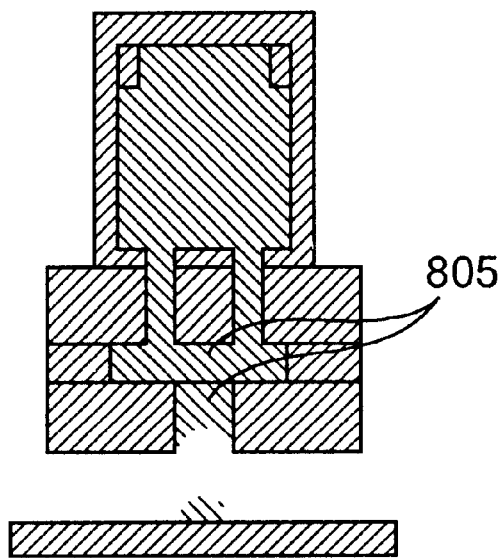
Figure 15:
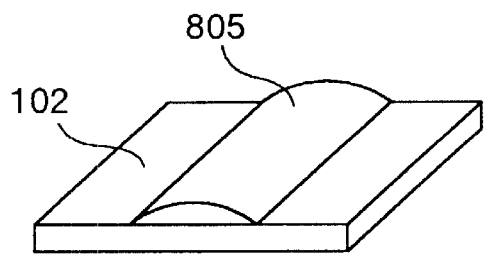
FIGS. 15 and 16 are perspective views showing a part of a line pattern which has been transferred according to the invention.
Figure 16:
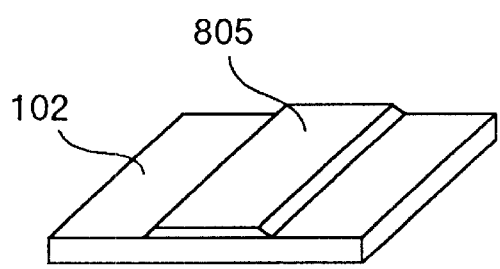
Figure 17:
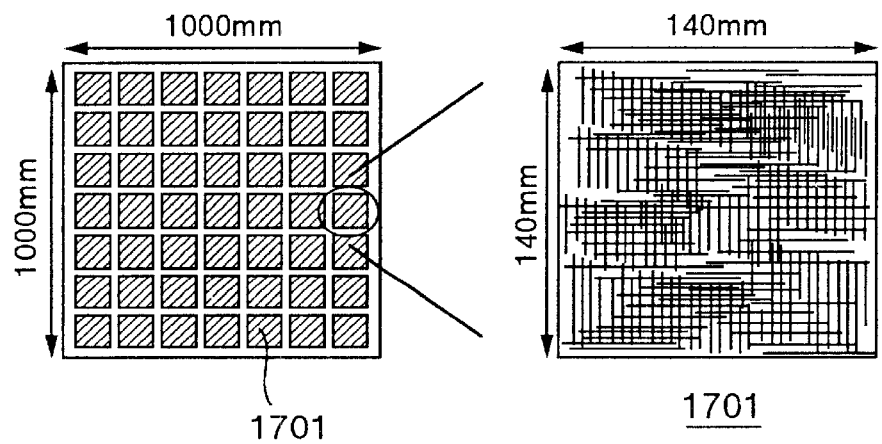
FIG. 17 is an explanatory view of a wiring pattern formed by step-and-repeat according to the invention.

Next, as shown FIG. 13, the original master 103 is spaced from the glass substrate 102 up to a distance of 100 $\mu$m, by the Z-axial moving mechanism 106. The pressure in the medium container 90 is automatically lowered as the medium 902 is cooled, and as shown in FIG. 14, the medium 805 retracts inward of the slit 804. FIG. 15 is a perspective view illustrating a part of a line pattern which has been formed by transferring the medium 805 onto the glass substrate 102. Then, the glass substrate 805 on which the medium 805 has been transferred, is thermally treated in an atmosphere composed of 90% of nitrogen gas and 20%of hydrogen gas at a temperature of 300 deg. C., for 5 min, and further, it is thermally treated in an atmosphere composed of 80% of nitrogen gas and 20% of oxygen gas at 300 deg. C. for 5 min. FIG. 16 is a perspective view illustrating a part of a line pattern after heat-treatment. Thus, a copper wiring pattern having a line width of 8 $\mu$m and a thickness of 0.5 $\mu$m is obtained. FIG. 17 shows an example having forty-nine (49) wiring patterns 1701 formed on the glass substrate 102, which has a square of 1 m, with the use of a step-and-repeat in combination of the above-mentioned step of transferring the medium 805 and the step of driving the movable stage 101. The wiring pattern 1701 has a side of 140 mm.

Although the explanation has been made of the formation of the copper wiring pattern in the above-mentioned embodiment, it is also possible to form a metal wiring by changing a metal contained in the medium pattern, such as molybdenum, chromium, gold, silver, nickel, titanium, tantalum, cobalt, indium, tin or zinc. With the use of palladium having a catalytic function for the medium during plating, the catalyst can be arranged as will be explained in an embodiment 5. Further, by adding an oxide substance, nitrogen gas or ammonium gas in an atmospheric gas containing oxygen gas during heat-treatment, a nitride substance can be produced. An organic substance containing silicon or germanium or an insulator such as alumina, silica or the like are used as a component of the medium, a semiconductor film or an insulating film may be formed in a predetermined shape. Further, an indium tin oxide substance, an indium zinc substance or an indium germanium oxide may be formed.

Embodiment 2

Figure 18:
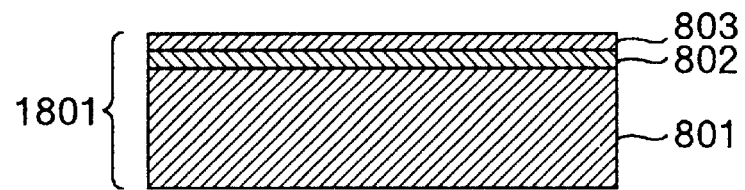
FIG. 18 is a sectional view of a SOI (Silicon on Insulator) used for an original master according to the invention.
Figure 19:
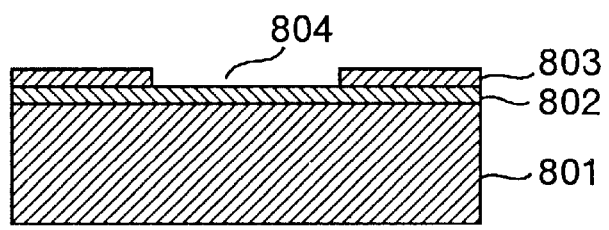
FIGS. 19 and 20 are sectional views of an original master for explaining a method of manufacturing the original master according to the invention.
Figure 20:
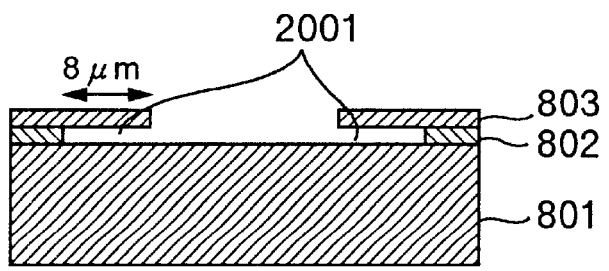

Explanation will be hereinbelow made of another embodiment of the invention. In this embodiment, a method of manufacturing an original master shown in FIG. 21 will be explained. FIG. 18 is a sectional view of an SIO (Silicone On Insulator) substrate 1801 used in the original master 130. The SOI substrate 1801 is composed of a silicon film 803 having a thickness of 1.0 $\mu$m and serving as a first layer, an oxide film 802 having a thickness of 1.5 μm and serving as a second layer, and a single crystal silicon substrate 801 having a thickness of 550 μm. The SOI substrate 1801 has a diameter of 100 mm. Next, a slit 804 is formed in the silicon film 803 by using a photography technique which is generally used for an LSI process so as to obtain a structure shown in FIG. 19. The slit has a width of 10 μm. The silicon film 802 is removed by using a dry-etching process. Next, the original master 103 is soaked in an hydrogen fluoride solution diluted with pure water so as to etch the silicon film 802, and accordingly, an air gap 2001 is formed overhanging underneath the silicon film 803 as shown in FIG. 20. The air gap 2001 has a width of 8 μm. With the above-mentioned manufacturing method, the formation of the original master 10 is completed.

As seen in FIG. 20, the original master 1801 composed of the silicon film 803 as the first layer and the oxide film 802 serving as the second layer, which are of different kinds, can be manufactured by bringing enchant fed from the slit into contact with the second layer so as to remove a part of the second layer. Further, it can be easily understood that, the width of the slit in the second layer can be larger than the width of the slit in the first layer by setting the etching time for the second layer to be longer.

Figure 21:
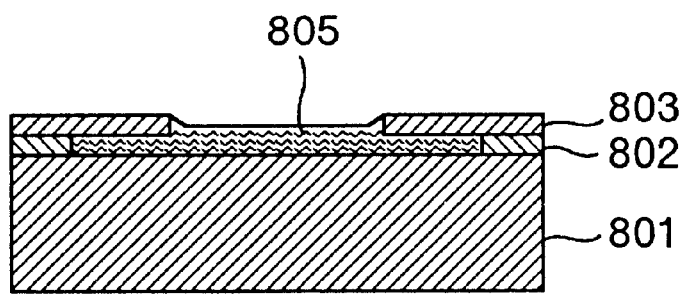
FIG. 21 is a sectional view showing a cross section of the original master when a medium is filled in the original master according to the invention.

FIG. 21 is a sectional view of the original master 103 filled therein with the medium 803. The medium 806 flows into the gap 2001 by a capillary effect. Since the medium 805 flows into the gap 2001, the medium 805 is filled in the slit 804 defining the wiring pattern.

It is noted that the surface of an oxide substance becomes hydrophilic if silicon is subjected to oxidation. To the contrary, the surface of silicon becomes hydrophobic if silicon is treated with a hydrogen fluoride solution. Accordingly, the structure shown in FIG. 20 may be thermally treated in an oxidized atmosphere so as to oxidize a silicon material in order to effectively obtain the capillary effect, thereby enabling the medium to easily flow into the gap 2001.

Embodiment 3

Figure 22:
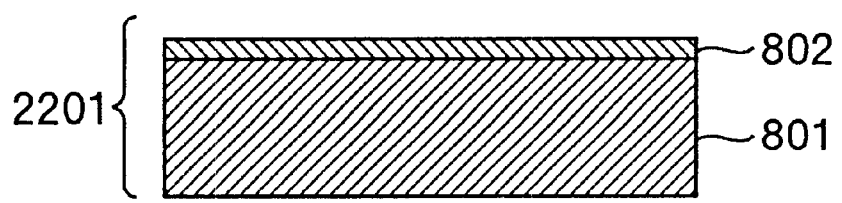
FIG. 22 is a sectional view of a substrate used in an original master according to the invention.
Figure 23:
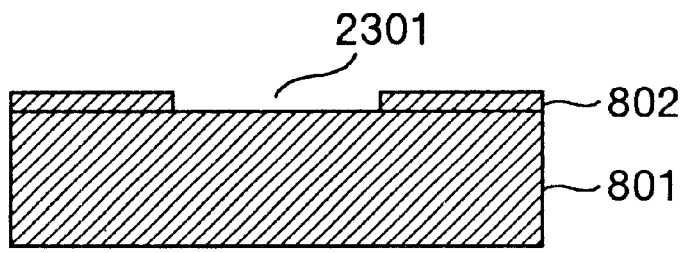
FIGS. 23 and 24 are sectional views of the original master for explaining a method of manufacturing the original master according to the invention.

Explanation will be made still another embodiment of the invention. In this embodiment, a method of manufacturing an original master 103 shown in FIG. 24 will be explained. FIG. 22 is a sectional view of a substrate 22 used in the original master 103. The substrate 2201 is composed of a single crystal substrate 801 having a thickness of 550 μm and an oxide film 802 having a thickness of 1.5 μm and formed on the silicon substrate 801. The oxide film 802 is formed by a thermal oxidation method. The substrate 2201 has a diameter of 100 mm. Then, a first slit 2301 is formed in the oxide film with the use of a lithography technique which is generally used in an LSI process so as to obtain a structure shown in FIG. 23. The first slit 2301 has a width of 10 μm. The oxidized film 802 is removed through an etching process with a hydrogen fluoride solution diluted with pure water. With the use of the lithography technique and the etching process, a second slit 2401 having a width of 1 μm and a depth of 3 μm is formed. The formation of the original master 103 is completed with the use of the above-mentioned method.

Figure 25:
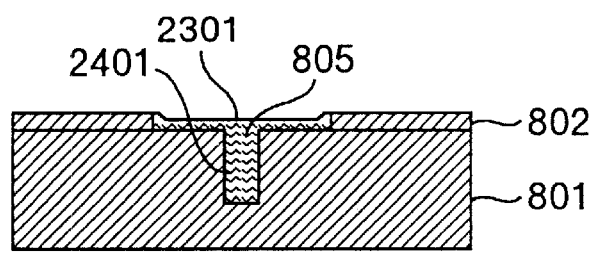
FIG. 25 shows a cross section of the original master when a medium is filled in the original master according to the invention.

FIG. 25 is a sectional view of the original master 103 filled therein with the medium 805. The medium 805 flows into the second slit 2401 by a capillary effect. Since the medium 805 flows into the second slit 2301, the medium can be filled in the first slit 2301 defining a wiring pattern.

It is noted that although in this embodiment the single second slit 2401 is formed in the first slit 2301, it is apparent that the transfer of the medium may be increased by forming more than two second slits.

Further, if silicon is subjected to oxidation, the surface of an oxide surface becomes hydrophilic. To the contrary, if silicon is treated with hydrogen fluoride solution, the surface of the oxide substance is hydrophobic. Thus, the structure shown in FIG. 24 may be subjected to heat treatment in an oxidized atmosphere so as to oxidize a silicon material in order to allow the medium to easily flow into the second slit 2401. Further, the side surfaces of the first slit 2301 and the second slit 2401 may be roughened in order to improve the wettability with the medium.

Embodiment 4

Figure 24:
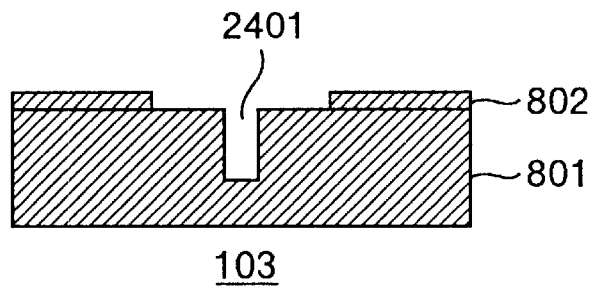

Explanation will be hereinbelow made of still another embodiment of the invention. In this embodiment, a method of feeding a medium into an original master, and a medium transfer mechanism in the original master will be explained. The mechanism for continuously feeding the medium 805 into the original master 103 shown in FIG. 20 or FIG. 24 is of a capillary effect by which the medium 805 flows through the gap 2001 and the second slit 2401. According to the invention, the medium sump 104 for continuously feeding the medium 805 into the original master 103 has been devised. The medium sump 104 is made into closed contact with the original master 104 as shown in FIG. 9. The medium sump 104 and the original master 104 are connected with each other by supply pipes 901. As the medium 805 is consumed during a transfer, the medium 902 is fed from a medium container 904 through the supply pipes 901. The supply pipes 901 are formed in the original master 103 having a square of 14 mm by a number of 100. The density of formation of the pipes 901 is such that there are formed more supply pipes 901 in a zone where the medium is highly consumed due to dense patterns since the pattern with the surface of the original master has roughness and fineness. Explanation will be made of an example of the lay-out of the supply pipes 901 with reference to FIG. 27.

Figure 27:
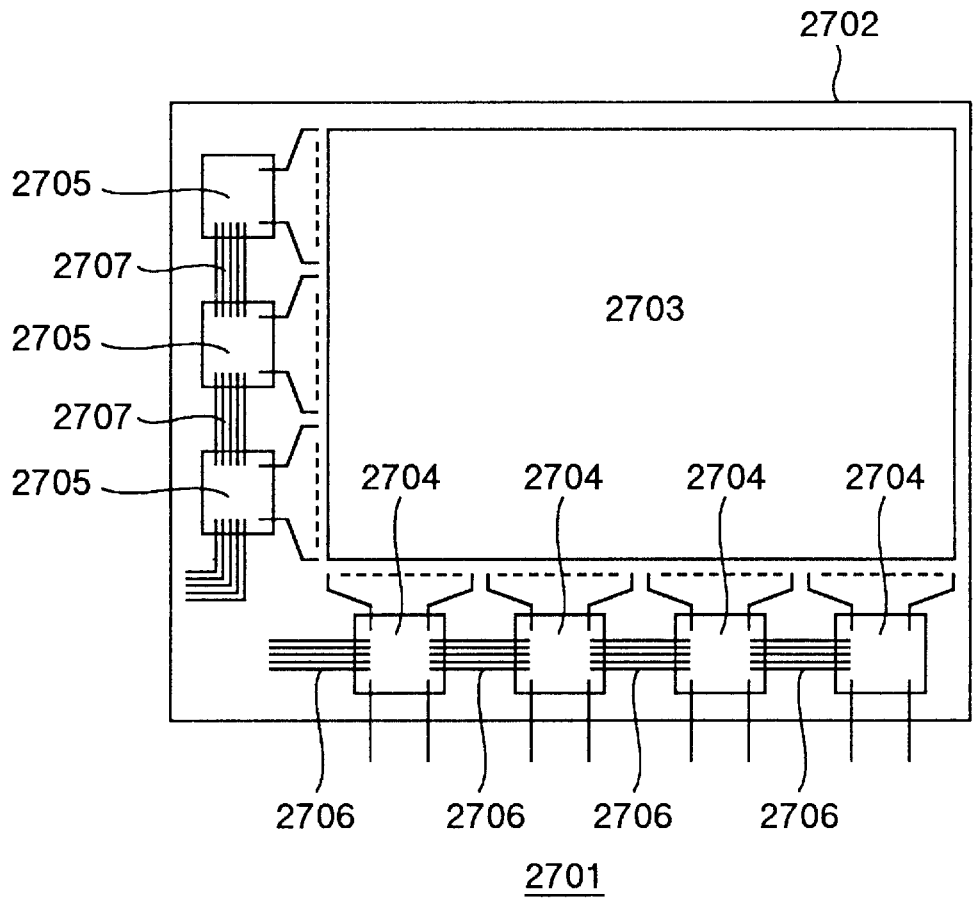
FIG. 27 is a lay-out view of a circuit in a thin-film transistor driven liquid crystal display unit experimentally produced according to the invention.

FIG. 27 shows the lay-out of a circuit for a thin film transistor driven liquid crystal display unit 2701 of a prototype. The thin film transistor driven liquid crystal display unit 2701 is formed on the upper surface of a transparent substrate 2702. A display part 2703 has a high density of wiring including gate electrodes since thin film transistors are laid-out each for each pixel in this part. Further, the pattern densities of drain semiconductor integrated circuits 2704 and gate semiconductor integrated circuits 2705 are high. However, the pattern densities of image signal bus lines 2704 and scan signal bus lines 2706 are low. In this embodiment, sixty (60) supply pipes 901 in total are formed in the display part 2703, thirty (30) supply pipes 901 in total are formed for the drain semiconductor integrate circuits 2704 and the gate semiconductor integrated circuits 2705 and ten (10) supply pipes 90 in total are formed for the image signal bus lines 2706 and the scan signal bus lines 2707.

Figure 32:
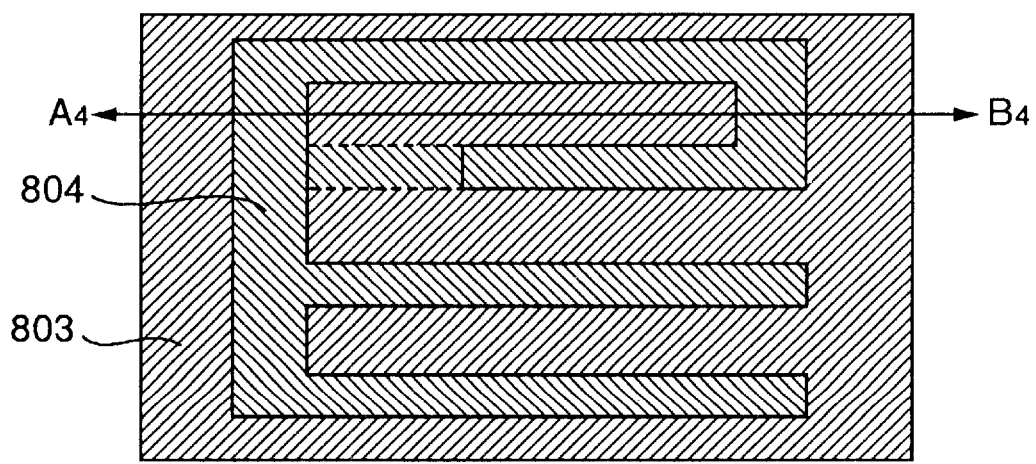
FIGS. 32 and 33 are plan views of an original master having a continuous line pattern according to the invention.
Figure 33:
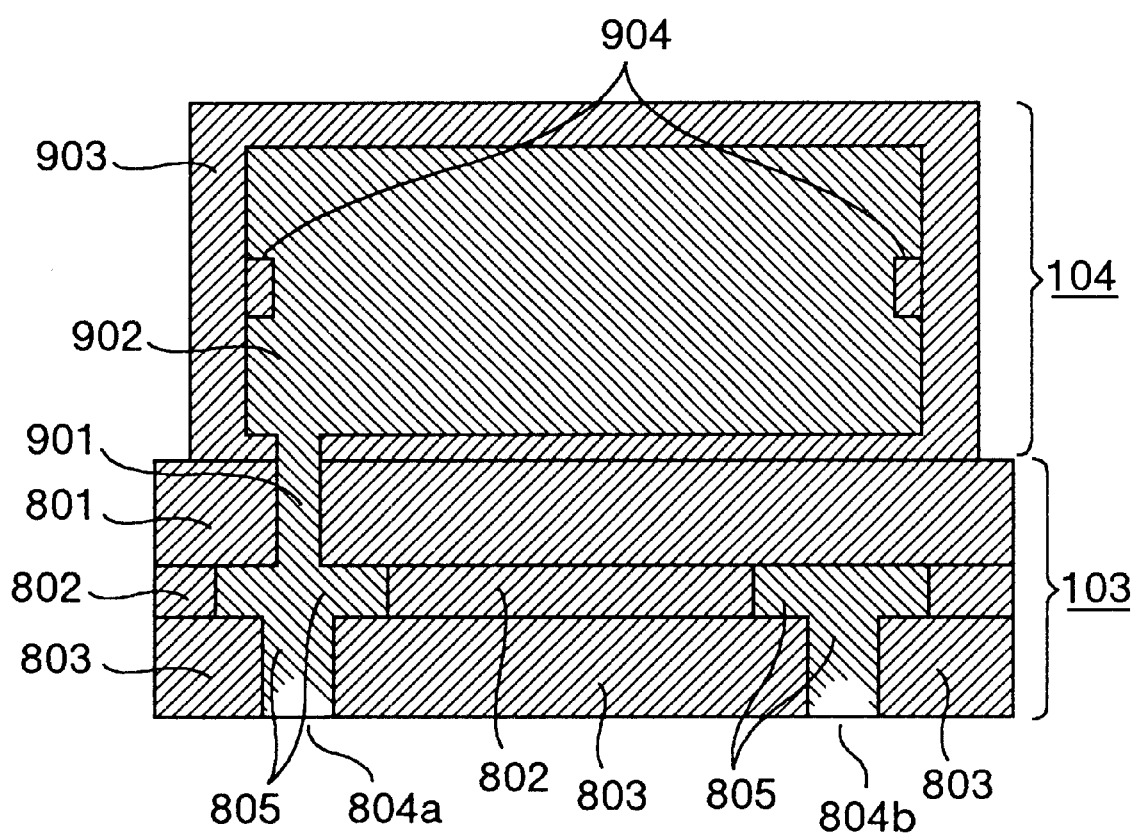

Next, explanation will be made of a method of feeding a medium when a continuous two-dimensional pattern displayed in the film transistor driven liquid crystal display unit 2701 is transferred. FIG. 32 is a plan view illustrating the original master 103 having a continuous two-dimensional pattern. A slit 804 formed in a silicon film 803 defines a continuous line pattern. FIG. 33 is a sectional view along line $A_4$–$B_4$ in FIG. 32. A single supply pipe 901 is connected to a zone where the oxide film 802 is removed, and accordingly, the medium 805 is fed to the slit 804 in it is entirety by the capillary effect.

Figure 26:
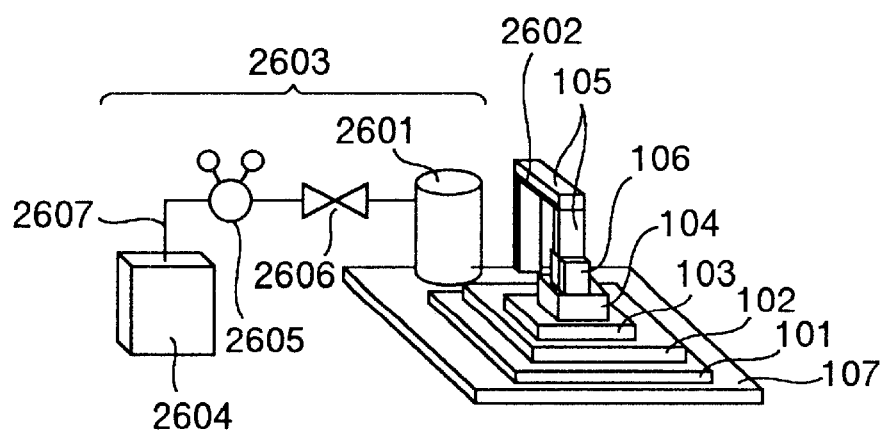
FIG. 26 is a perspective view of a lithography apparatus for explaining a method of and a structure for feeding a medium into a medium sump according to the invention.

Next, explanation will be made of the method and the structure for feeding the medium into the medium sump 104 with reference to FIG. 26. A supply tank 2601 externally installed is used for the supply of the medium 902 into the medium sump 104. The supply tank 2601 and the medium sump 104 are connected with each other through the intermediary of a supply pipe 2602 so as to provide such a mechanism that the medium is fed from the supply tank 2601 into the medium sump 104 in order to always fill the medium 902 in the liquid sump 104. The capacity of the supply tank 2601 is one little. The pressure in the supply tank 2601 is held always at a value which is higher than the atmospheric pressure by 0.1 atm by a pressurizing mechanism 2603 which is composed of a pressure tank 2604, a pressure regulator valve 2605, a shut-off valve 2606 and a metal pipe 2607. It is noted that the shut-off valve 2606 is of a normally open type and is arranged to cut off the supply of the medium when the supply tank 2601 is replenished with the medium or when the supply of the medium is cut off upon emergency.

Embodiment 5

Figure 28:
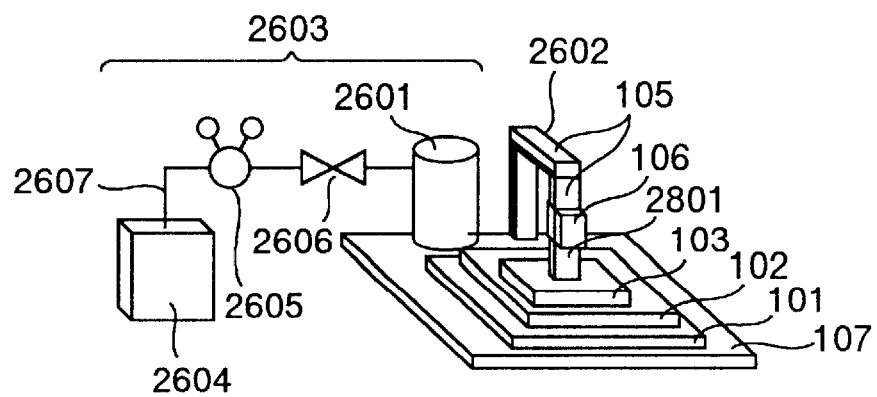
FIG. 28 is a perspective view of the lithographic apparatus used in the invention.

Explanation will be hereinbelow made of still another embodiment of the invention. In this embodiment, an apparatus for and a method of forming wiring by arranging catalyst and performing plating will be explained. FIG. 28 is perspective view of the lithography apparatus used. A glass substrate having a one side of 1 mm length is set on a movable stage 101. The movable stage 101 can move the glass substrate 102 over a horizontal plane by means of stepping motors. An injection mechanism 2801 is fixed by a Z-axial moving mechanism 106 which is coupled to a stationary base 107 through the intermediary of a support arm 105, and which can move the injection mechanism 2801 in the Z-axial direction.

Figure 29:
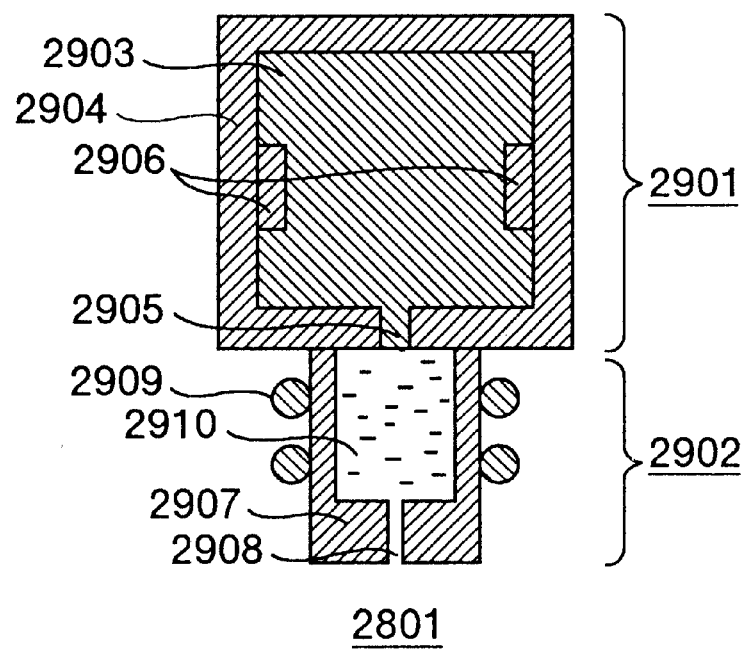
FIG. 29 is a sectional view of an injection mechanism in the apparatus of FIG. 28.

FIG. 29 is a sectional view of the injection mechanism 2801. The injection mechanism 2801 is composed of a medium sump 2901 and a carburetor 2909. The medium sump 2901 is composed of a medium container 2904 containing therein medium 2903 and a first heater 2906. A first orifice 2905 having a diameter of 0.5 mm is opened to the medium container 2904. The carburetor 2902 is composed of a carburetor container 2907 and a second heater 2909 for heating the carburetor container 2907. A second orifice 2908 having a diameter of 50 nm is opened to the carburetor container 2907. The pressure in the medium container 2904 is increased by energizing the first heater 2906, and accordingly, the medium 2903 is fed through the first orifice 2905 and into an evaporation chamber 2910 in which it is evaporated. Thus, the medium is jetted from the second orifice 2908.

A supply tank 2601 externally provided, as shown in FIG. 28, is used for the supply of the medium 2903 into the medium container 2904. The supply tank 2601 and the medium container 2904 are connected with each other by supply pipes 2606 so that the medium is fed from the supply tank 2601 through the supply pipes 2602 in order to always fill the medium 2903 in the medium container 2904. The supply tank 2601 has a capacity of 1 little. The pressure in the supply tank 2601 is held always at a value which is higher than the atmospheric pressure by 0.1 atm by a pressurizing mechanism 2603 which is composed of a pressure tank 2604, a pressure regulator valve 2605, a shut-off valve 2606 and a metal pipe 2607. It is noted that the shut-off valve 2606 is of a normally open type and is arranged to cut off the supply of the medium when the supply tank 2601 is replenished with the medium or when the supply of the medium is cut off upon emergency.

Next, explanation will be made of a method of forming copper wiring with reference to FIGS. 28 and 29. At first, as shown in FIG. 28, a glass substrate 102 is set on a movable stage 101. The glass substrate 102 is a square shape having a side of 1 m length. The distance between the glass substrate 102 and the injection mechanism 2801 is 100 $\mu$m. The pressure in the supply tank 2601 is increased by the pressurizing mechanism 2603 so as to be higher than the atmospheric pressure by 0.1 atm in order to fill the medium 2903 in the medium container 2904, thereby filling the medium 2903 in the medium container 2904. In this embodiment, palladium is used as an initiator.

Further, an evaporation container 2907 made of aluminum is held at a temperature of about 150 deg. C. in such a condition the second heater 2909 is energized. Then, the injection mechanism 2801 is moved toward the glass substrate 102 by the Z-axial moving mechanism 106 so as to allow the glass substrate 102 to approach the original master 103 up to a distance of 10 $\mu$m. It is noted that the Z-axial moving mechanism 106 is adapted to be driven by applying a voltage to a piezoelectric element. Then, the first heater 2906 in the medium container 2904 made of aluminum is energized. The movable stage 101 is driven in such a condition that the first heater 2906 is energized, and a predetermined pattern is transferred onto the glass substrate 102. After completion of the drawing of the line pattern, the first heater 2906 is deenergized. Further, the movable stage 101 is moved so that the second orifice 2908 of the injection mechanism 2801 comes to a start position of a next line pattern. Further, similar steps are taken so as to transfer a predetermined pattern onto the glass substrate 102. With the repetitions of the above-mentioned steps, all wiring patterns are transferred. After completion of the wiring patterns, the glass substrate 102 is subjected to electroless copper plating so as to obtain a copper wiring pattern having a line width of 80 nm.

Although the copper wiring is formed in this embodiment, it is apparent that the wiring may be formed of nickel, cobalt, palladium, gold, silver, platinum or tin by changing catalyst and plating solutions.

According to the invention, an apparatus for and a method of batch-transferring a wiring pattern onto a lithographic substrate by allowing a medium to ooze out from an original master having a predetermined wiring pattern within a secondary-dimensional plane, to a lithographic substrate, can be obtained, and accordingly, it is possible to have such an advantage that the manufacture of electronic parts can be easily done. In particular, it is possible to obtain such an effect that the density of metal particles in the medium can be enhanced.

According to the invention, at least one supply pipe for the medium is connected to the slit in a continuous two-dimensional pattern, it is possible to obtain such an advantage that a closed line pattern or a continuous line pattern can be conveniently transferred.

According to the invention, since the two layers, that is, the first layer and the second layer are formed on the surface of the original master in the mentioned order, and since the medium to be transferred can be fed into the hollow zone formed by removing a part of the second layer by a capillary effect, it is possible to obtain such an advantage that the medium can be fed in the slit in its entirety, which is formed in a two-dimensional plane. Further, with the provision of the narrow slit in the bottom surface of the first slit for allowing the medium to ooze out onto the lithographic substrate, the medium can be fed into the narrow slit by the capillary effect, thereby it is possible to obtain such an effect that the medium can be fed into the slit in its entirety, which is formed in a two-dimensional plane.

According to the invention, with the provision of at least one supply pipe connected to the slit defining a closed line pattern or a continuous two-dimensional pattern, it is possible to obtain such an advantage that the medium can be conveniently fed into the pattern in its entirety by a capillary effect.

According to the invention, with the provision of the first layer and the second layer of at least two different kinds are formed on the substrate, the original master is impregnated with etchant in the second layer after the slit is formed in the first layer on the surface side, so as to bring the etchant into contact with the second layer through the slit formed in the first layer. With this method, it is possible to obtain such an effect that the second layer can be removed with the same layout as that of the first layer in a self-aligning manner. Further, it is possible to obtain such an advantage that the slit formed in the first layer is formed with an overhang zone by prolonging the etching time for the second layer.

According to the invention, since the medium is fed to the lithographic substrate after the medium is evaporated, no formation of liquid droplets is required, and accordingly, the medium can be jetted from a fine orifice. Thereby it is possible to obtain such an advantage that a fine pattern can be drawn.

According to the invention, since a fine pattern can be drawn on the substrate by jetting catalyst from a fine orifice after a medium containing the catalyst is evaporated, the catalyst drawn by plating can be plated with metal. Thereby it is possible to obtain such an effect that a fine metal pattern can be formed by plating.

What is claimed is:

1. An apparatus for batch-transferring a two-dimensional pattern onto a lithographic substrate, comprising an original master formed therein with a slit defining the pattern, a medium sump for supplying into the slit a medium to be transferred, a pressure regulating mechanism for adjusting a pressure of the medium filled in the slit, and a lithographic substrate.

2. An apparatus according to claim 1, wherein at least one medium supply pipe is provided between the medium sump and the slit for a continuous two-dimensional pattern.

3. A lithographic apparatus comprising an original master formed with a slit defining a two-dimensional pattern in a substrate, a medium sump for feeding into the slit a medium to be transferred, a pressure regulating mechanism for adjusting a pressure of the medium filled in the slit, and a lithographic substrate, wherein at least two layers, that is, a first layer and a second layer are formed on a surface of the original master in this order, and the second layer is formed therein with a slit having the same lay-out as that of the slit formed in the first layer and defining the two-dimensional pattern.

4. A lithographic apparatus comprising an original master formed with a slit defining a two-dimensional pattern in a substrate, a medium sump for feeding into the slit a medium to be transferred, a pressure regulating mechanism for adjusting a pressure of the medium filled in the slit, and a lithographic substrate, wherein the slit is composed of a first slit on a surface side of the original master, and at least one second slit formed in the first slit.

5. A lithographic apparatus comprising an original master formed with a slit defining a two-dimensional pattern in a substrate, a medium sump for feeding into the slit a medium to be transferred, a pressure regulating mechanism for adjusting a pressure of the medium filled in the slit, and a lithographic substrate, wherein at least two layers, that is, a first layer and a second layer are formed on a surface of the original master in this order, and the medium is fed from the medium sump into a hollow zone formed by removing a part of the second layer, by a capillary effect to be fed into the slit.

6. A lithographic apparatus according to claim 5, further comprising at least one supply pipe disposed between the medium sump and the slit, wherein the medium is fed from the medium sump into the slit defining a continuous two-dimensional pattern through the supply pipe.

7. An apparatus according to claim 1 for transferring a pattern onto a lithographic substrate, wherein the pattern is drawn with an evaporated medium.

8. An apparatus according to claim 7, wherein a substance serving as an initiator is contained in the medium for drawing.

9. An apparatus according to claim 8, wherein palladium is used as an initiator.

* * * * *